United States Patent
Bao et al.

(10) Patent No.: US 7,989,356 B2
(45) Date of Patent: Aug. 2, 2011

(54) SEMICONDUCTOR DEVICE AND METHOD OF FORMING ENHANCED UBM STRUCTURE FOR IMPROVING SOLDER JOINT RELIABILITY

(75) Inventors: Xusheng Bao, Singapore (SG); Yaojian Lin, Singapore (SG); Tae Hoan Jang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 217 days.

(21) Appl. No.: 12/410,260

(22) Filed: Mar. 24, 2009

(65) Prior Publication Data

US 2010/0244239 A1 Sep. 30, 2010

(51) Int. Cl.
*H01L 23/498* (2006.01)
(52) U.S. Cl. .................. 438/737; 257/778; 257/E23.06; 257/E21.506
(58) Field of Classification Search .................. 257/737, 257/738, E23.06, E21.506, 778; 438/614, 438/108, 109, 107
See application file for complete search history.

(56) References Cited

U.S. PATENT DOCUMENTS

| | | | |
|---|---|---|---|
| 6,853,076 B2 * | 2/2005 | Datta et al. ..................... 257/738 |
| 7,112,522 B1 * | 9/2006 | Tsao et al. ..................... 438/612 |
| 7,682,961 B2 * | 3/2010 | Daubenspeck et al. ....... 438/615 |
| 2004/0134974 A1 | 7/2004 | Oh et al. |
| 2005/0140027 A1 | 6/2005 | Fan |

* cited by examiner

*Primary Examiner* — Roy K Potter
(74) *Attorney, Agent, or Firm* — Robert D. Atkins; Patent Law Group

(57) ABSTRACT

A semiconductor device has a first conductive layer formed over a substrate. A first insulating layer is formed over the first conductive layer. A second conductive layer is formed over first insulating layer and first conductive layer. A third insulating layer is formed over the second insulating layer and second conductive layer. An under bump metallization layer (UBM) is formed over the third insulating layer and second conductive layer. A UBM build-up structure is formed over the UBM. The UBM build-up structure has a sloped sidewall and is confined within a footprint of the UBM. The UBM build-up structure extends above the UBM to a height of 2-20 micrometers. The UBM build-up structure is formed in sections occupying less than an area of the UBM. A solder bump is formed over the UBM and UBM build-up structure. The sections of the UBM build-up structure provide exits for flux vapor escape.

24 Claims, 4 Drawing Sheets

SEMICONDUCTOR DEVICE AND METHOD OF FORMING ENHANCED UBM STRUCTURE FOR IMPROVING SOLDER JOINT RELIABILITY

FIELD OF THE INVENTION

The present invention relates in general to semiconductor devices and, more particularly, to a semiconductor device and method of forming an enhanced under bump metallization structure for improving solder joint reliability.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

One common technique of interconnecting a semiconductor die with a printed circuit board or other device involves the use of solder bumps. FIG. 1 shows a conventional solder bump structure. A conductive layer 3 is formed over substrate 2. Conductive layer 3 is a metal pad. An insulating or dielectric layer 4 is formed over substrate 2 and conductive layer 3. A portion of insulating layer 4 is removed by an etching process to expose conductive layer 3. An insulating or passivation layer 5 is formed over conductive layer 3 and insulating layer 4. A portion of insulating layer 5 is removed by an etching process to expose conductive layer 3. A conductive layer 6 is formed over conductive layer 3 and insulating layer 5. Conductive layer 6 is a redistribution layer to route electrical signals from conductive layer 3 to a later-formed solder bump. An insulating or passivation layer 7 is formed over conductive layer 6 and insulating layer 5. A portion of insulating layer 7 is removed by an etching process to expose conductive layer 6. A conductive layer 8 is formed over conductive layer 6 and insulating layer 7. Conductive layer 8 is an under bump metallization (UBM) layer for the solder bump. UBM 8 is substantially flat. FIG. 1b shows a cross-sectional view across UBM 8. Solder bump 9 is formed on UBM 8.

The joint interface area between UBM 8 and solder bump 9 is important to the solder joint reliability. A large UBM pad size generally results in more metal contact area and better solder joint reliability. However, if the UBM pad is too large in comparison to the solder bump height, the solder joint can develop voids which can cause product defects. In addition, a large UBM pad consumes area which is counter to the general goal of smaller feature size.

SUMMARY OF THE INVENTION

A need exists to minimize the UBM footprint while maintaining solder joint reliability. Accordingly, in one embodiment, the present invention is a method of making a semiconductor device comprising the steps of providing a substrate, forming a first insulating layer over the substrate, forming an under bump metallization layer (UBM) over the first insulating layer, and forming a build-up structure over the UBM. The build-up structure is confined within a footprint of the UBM. The method further includes the step of forming a solder bump over the UBM and build-up structure.

In another embodiment, the present invention is a method of making a semiconductor device comprising the steps of providing a substrate, forming a first insulating layer over the substrate, forming a first conductive layer over the first insulating layer, forming a UBM build-up structure over the first conductive layer, and forming a solder bump over the first conductive layer and UBM build-up structure.

In another embodiment, the present invention is a method of making a semiconductor device comprising the steps of providing a substrate, forming a first insulating layer over the substrate, forming a first conductive layer over the first insulating layer, forming a UBM build-up structure over the first conductive layer, and forming an interconnect structure over the first conductive layer and UBM build-up structure.

In another embodiment, the present invention is a semiconductor device comprising a substrate and first insulating layer formed over the substrate. A first conductive layer is formed over the first insulating layer. A UBM build-up structure is formed over the first conductive layer. An interconnect structure is formed over the first conductive layer and UBM build-up structure.

DETAILED DESCRIPTION OF THE DRAWINGS

Figure 1:
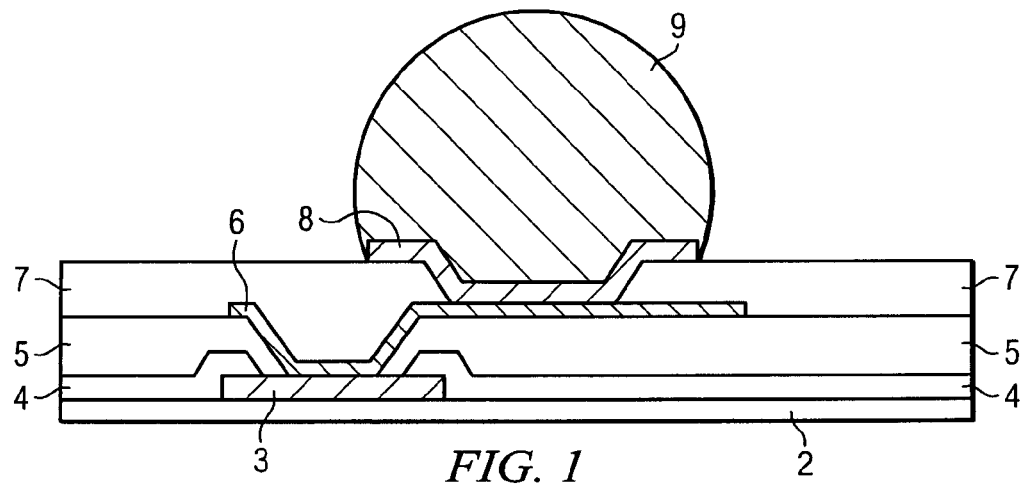
FIG. 1 illustrates a conventional solder bump structure.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electrolysis plating processes. Each layer is generally patterned to form portions of active components, passive components, or electrical connections between components.

The layers can be patterned using photolithography, which involves the deposition of light sensitive material, e.g., photo resist, over the layer to be patterned. A pattern is transferred from a photo mask to the photo resist using light. The portion of the photo resist pattern subjected to light is removed using a solvent, exposing portions of the underlying layer to be patterned. The remainder of the photo resist is removed, leaving behind a patterned layer. Alternatively, some types of materials are patterned by directly depositing the material into the areas or voids formed by a previous deposition/etch process using techniques such as electrolysis and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
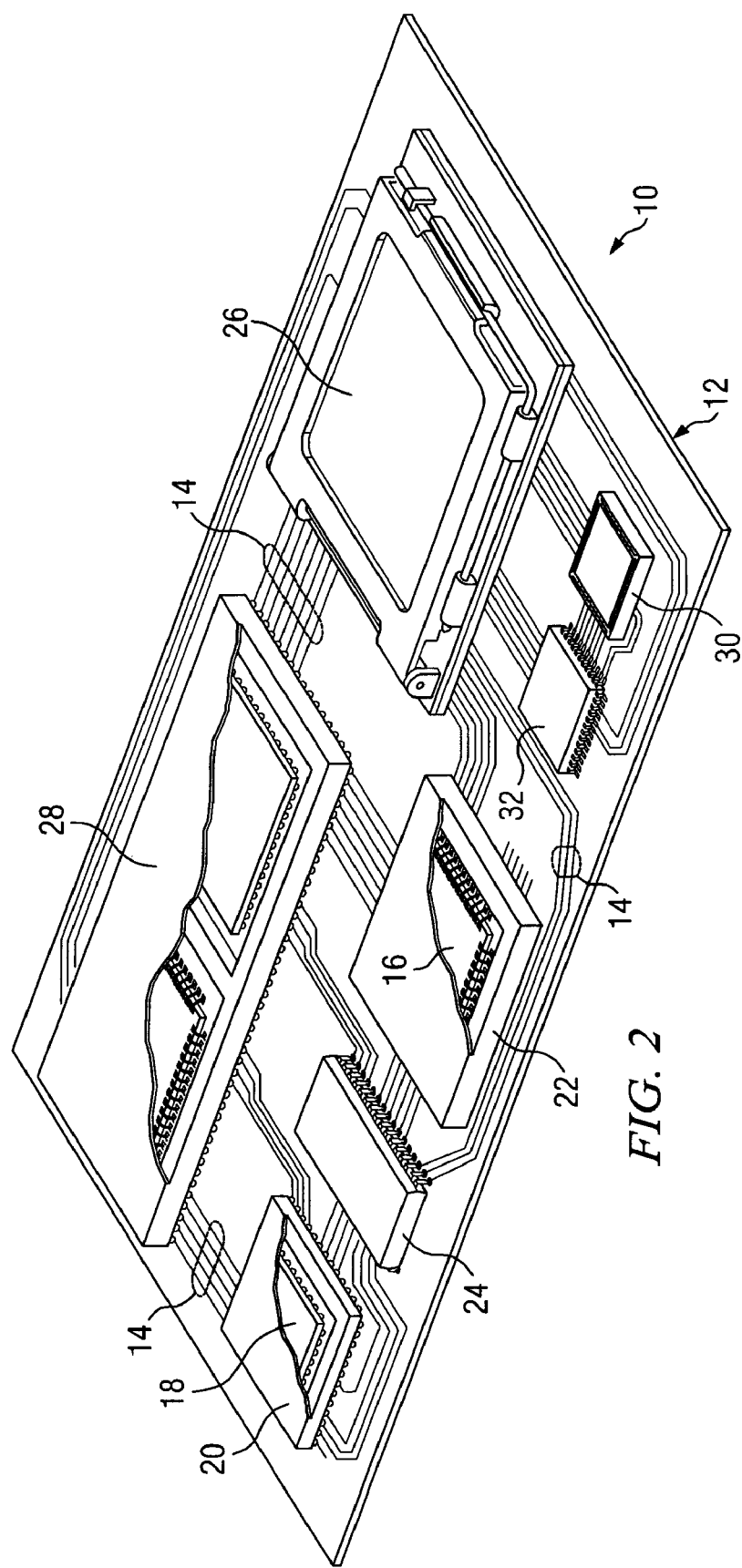
FIG. 2 illustrates a printed circuit board (PCB) with different types of packages mounted to its surface.

FIG. 2 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 2 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 2, PCB 12 provides a general substrate for structural support and electrical interconnect of the semiconductor packages mounted on the PCB. Conductive signal traces 14 are formed over a surface or within layers of PCB 12 using evaporation, electrolytic plating, electrolysis plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 3A:
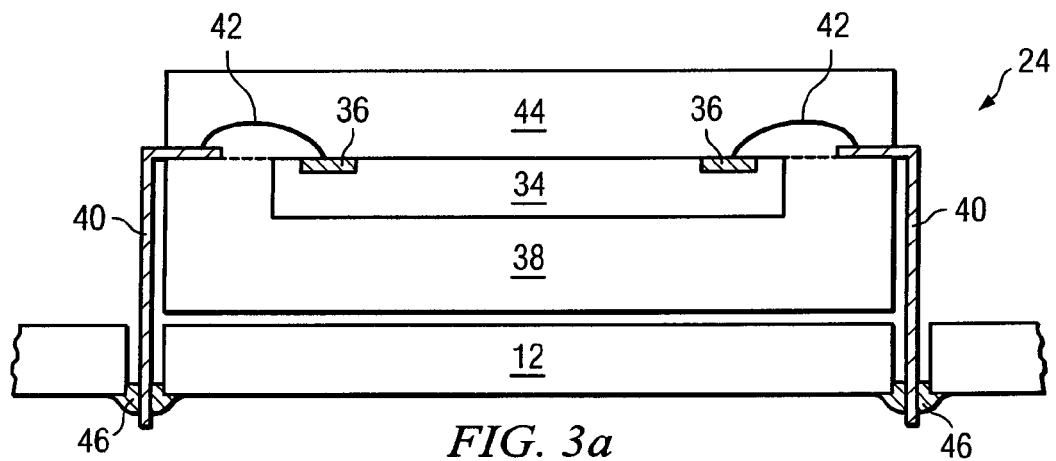
FIGS. 3a-3c illustrate further detail of the representative semiconductor packages mounted to the PCB.

FIG. 3a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electrolysis plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 3B:
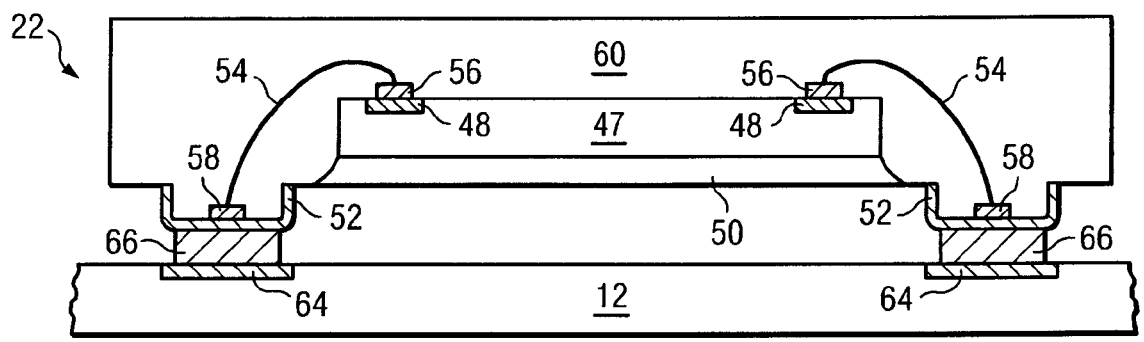

FIG. 3b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electrolysis plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electrolysis plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 3C:
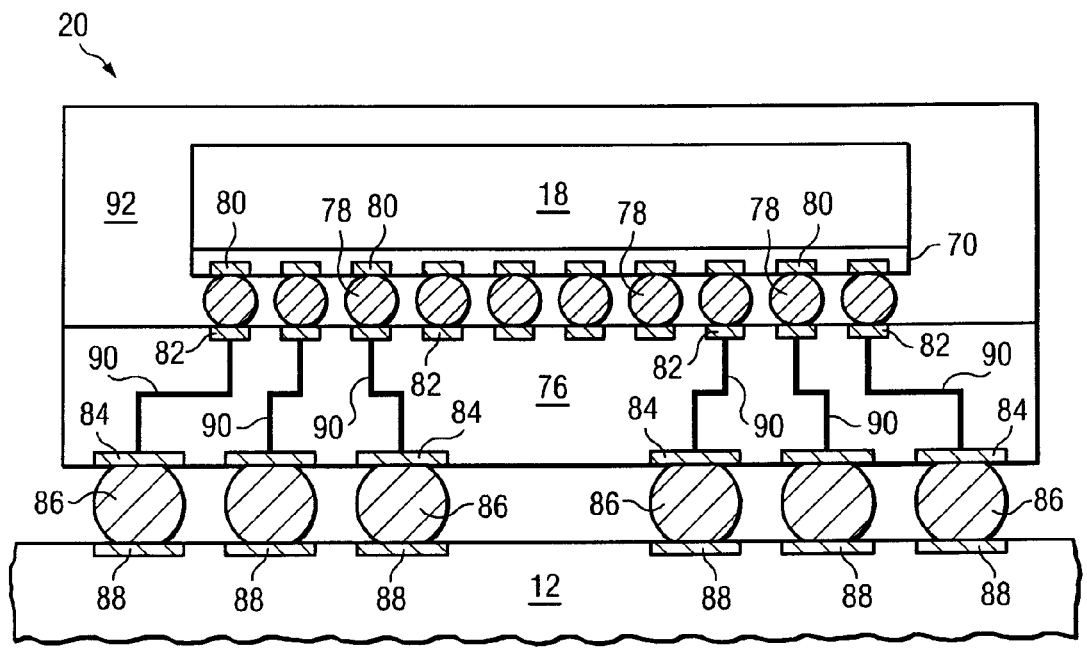

In FIG. 3c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electrolysis plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electrolysis plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

Figure 4A:
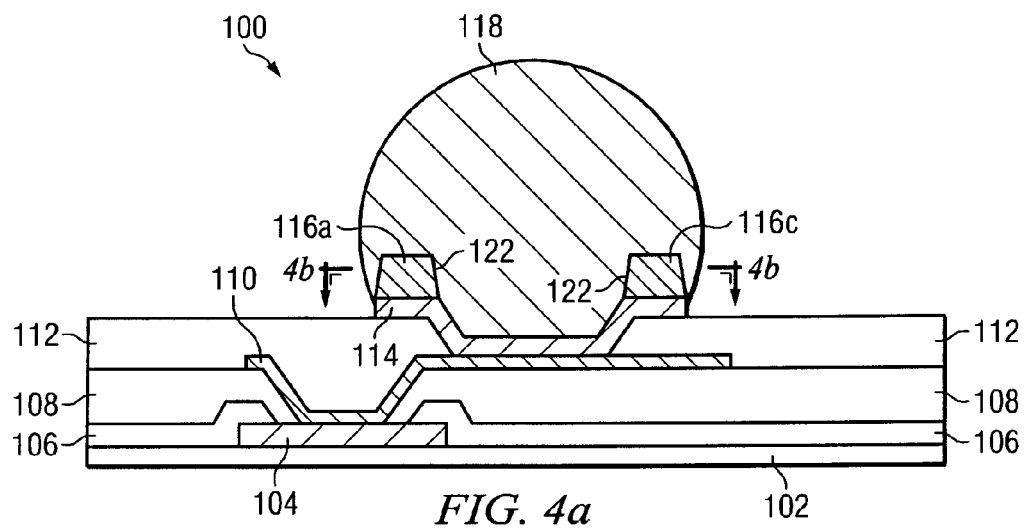
FIGS. 4a-4b illustrate a UBM build-up structure with sloped sidewalls.

FIG. 4a shows solder bump structure 100 formed using the semiconductor manufacturing processes described above. A substrate or wafer 102 is made with a semiconductor base material such as silicon, germanium, gallium arsenide, indium phosphide, or silicon carbide. One or more semiconductor die, as described above, are formed on or mounted to substrate 102. Each semiconductor die includes analog or digital circuits implemented as active and passive devices, conductive layers, and dielectric layers formed over its active surface and electrically interconnected according to the electrical design of the die. For example, the circuit may include one or more transistors, diodes, and other circuit elements formed within the active surface to implement baseband analog circuits or digital circuits, such as digital signal processor (DSP), memory, or other signal processing circuit. The semiconductor die may also contain IPD, such as inductors, capacitors, and resistor, for RF signal processing.

An electrically conductive layer 104 is patterned and deposited over substrate 102. Conductive layer 104 can be one or more layers of Al, Cu, Sn, Ni, Au, Ag, or other suitable electrically conductive material. Conductive layer 104 is formed using PVD, CVD, electrolytic plating, electrolysis plating process, or other suitable metal deposition process. Conductive layer 104 is a metal pad having electrical connection to the active and passive devices, IPDs, and conductive layers disposed in the semiconductor die.

A dielectric or insulating layer 106 is formed over substrate 102 and conductive layer 104. The dielectric layer 106 can be one or more layers of silicon dioxide (SiO2), silicon nitride (Si3N4), silicon oxynitride (SiON), tantalum pentoxide (Ta2O5), zircon (ZrO2), aluminum oxide (Al2O3), polyimide, benzocyclobutene (BCB), polybenzoxazoles (PBO), or other material having suitable electrical insulating properties. The dielectric layer 106 is patterned or blanket deposited using PVD, CVD, printing, spin coating, sintering with curing, or thermal oxidation. A portion of dielectric layer 106 is removed by an etching process to expose conductive layer 104.

An optional repassivation or insulating layer 108 is formed over dielectric layer 106 and conductive layer 104. The passivation layer 108 can be one or more layers of SiO2, Si3N4, SiON, Ta2O5, Al2O3, polyimide, epoxy-based dielectric polymer, PBO, or other material having insulating and structural properties. The passivation layer 108 is patterned or blanket deposited using PVD, CVD, printing, spin coating, sintering with curing, or thermal oxidation. A portion of passivation layer 108 is removed by an etching process to expose conductive layer 104.

An optional electrically conductive layer 110 is patterned and deposited over passivation layer 108 and conductive layer 104. Conductive layer 110 can be one or more layers of Al, Cu, Sn, Ni, Au, Ag, Ti, TiW, or other suitable electrically conductive material. Conductive layer 110 typically has a top layer with good wetting capability to solder material. For example, conductive layer 110 can be multiple layers of TiW/Cu, Ti/Cu, Ti/NiV/Cu, or TiW/NiV/Cu. Conductive layer 110 uses PVD, CVD, electrolytic plating, electrolysis plating process, or other suitable metal deposition process. Conductive layer 110 operates as a runner or redistribution layer (RDL) to extend the interconnectivity of conductive layer 104.

An optional passivation or insulating layer 112 is formed over passivation layer 108 and conductive layer 110. The passivation layer 112 can be one or more layers of SiO2, Si3N4, SiON, Ta2O5, Al2O3, polyimide, epoxy-based dielectric polymer, PBO, WPR, or other material having insulating and structural properties. The passivation layer 112 is patterned or blanket deposited using PVD, CVD, printing, spin coating, sintering with curing, or thermal oxidation. A portion of passivation layer 112 is removed by an etching process to expose conductive layer 110.

An electrically conductive layer 114 is patterned and deposited over passivation layer 112 and conductive layer 110. Conductive layer 114 can be one or more layers of Al, Cu, Sn, Ni, Au, Ag, or other suitable electrically conductive material with a top layer having good wetting capability to solder material, e.g. Cu or Au. Conductive layer 114 uses selective Cu electroplating, electrolysis plating process, or other suitable metal deposition process. Conductive layer 114 operates as an under bump metallization layer (UBM) or bump pad for conductive layer 110. In one embodiment, UBM 114 has a footprint or diameter of 50-300 micrometers (μm). UBM 114 can be a multi-metal stack with adhesion layer, barrier layer, and seed or wetting layer. The adhesion layer is formed over conductive layer 110 and can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer between conductive layer 110 and subsequent solder bumps or other interconnect structure. UBM 114 provides a low resistive interconnect to conductive layer 110, as well as a barrier to solder diffusion and seed layer for solder wettability.

Figure 4B:
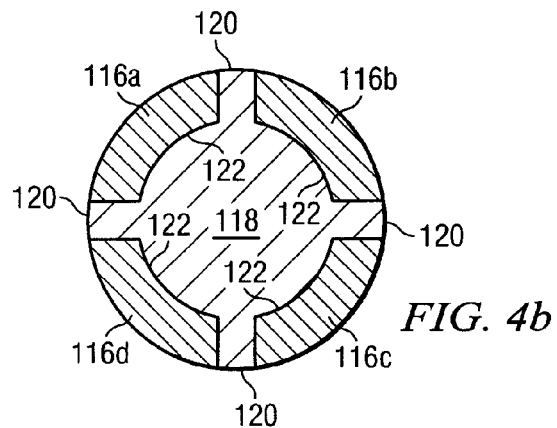

An electrically conductive layer 116 is patterned and deposited over UBM 114 as individual portions or sections 116a-116d. Conductive layer 116 can be one or more layers of Al, Cu, Sn, Ni, Au, Ag, or other suitable electrically conductive material. Conductive layer 116 uses selective Cu electroplating, electrolysis plating process, or other suitable metal deposition process. Conductive layer 116 is a part of a build-up structure or area over UBM 114. FIG. 4b is a top view of conductive layer 116a-116d and UBM 114. Conductive layer 116 can be an isolated island at a top edge of UBM 114. The overall size of conductive layer 116 is similar to the size of UBM 114.

An electrically conductive solder material is deposited over conductive layers 114 and 116 using an evaporation, electrolytic plating, electrolysis plating, ball drop, or screen printing process. The solder material can be any metal or other electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical ball or bump 118. In some applications, solder bump 118 is reflowed a second time to improve electrical contact to conductive layers 114 and 116. Solder bumps 118 represent one type of interconnect structure that can be formed over UBM 114. The interconnect structure can also use bond wires, 3-D interconnects, conductive paste, stud bump, micro bump, or other electrical interconnect.

Conductive layer 116 enhances UBM 114 for better solder joint reliability. The sidewalls 122 of conductive layer portions 116a-116d are sloped and vertical, extending up from UBM 114 to a height of 2-20 μm. In one embodiment, sidewalls 122 are 8 μm in height. The additional height conductive layer 116a-116d increases the metal contact area for better solder joint reliability without increasing the footprint of UBM 114. Conductive layer 116a-116d also buffers the stress concentration at the top edge of UBM 114, which is typically the point most susceptible to cracking. The enhanced UBM structure 114-116 redistributes the stress from the edge of the contact area of solder bump 118 and UBM 114 to the center area so as to improve solder joint reliability. The height of solder bump 118 can be increased without making the UBM footprint larger and without loss of solder joint reliability. The gaps or exits 120 between conductive layer portions 116a-116d provide a flux vapor escape path, away from the sloped sidewalls of conductive layer 116, to minimize formation of voids under solder bumps 118.

Figure 5A:
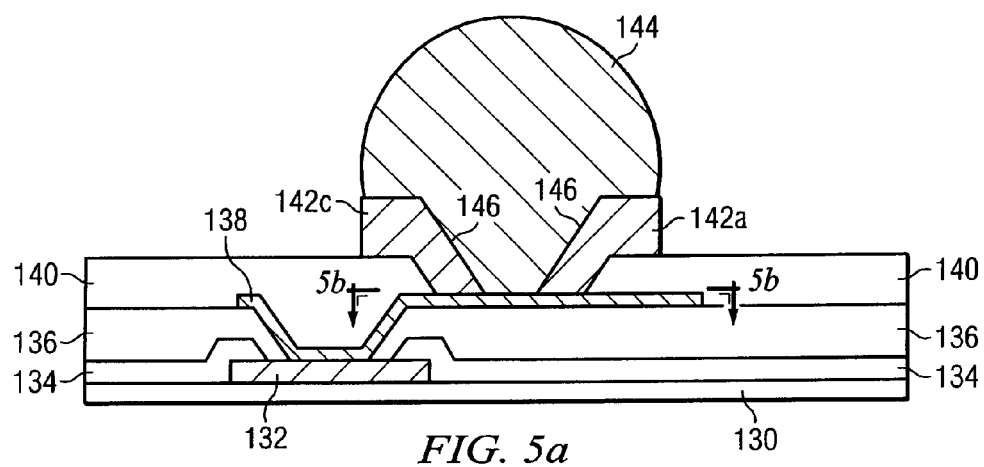
FIGS. 5a-5b illustrate an alternate embodiment of the UBM build-up structure with sloped sidewalls.

FIG. 5a shows another embodiment of the enhanced solder bump structure. A substrate or wafer 130 is made with a semiconductor base material such as silicon, germanium, gallium arsenide, indium phosphide, or silicon carbide. One or more semiconductor die, as described above, are formed on or mounted to substrate 130. Each semiconductor die includes analog or digital circuits implemented as active and passive devices, conductive layers, and dielectric layers formed over its active surface and electrically interconnected according to the electrical design of the die. For example, the circuit may include one or more transistors, diodes, and other circuit elements formed within the active surface to implement baseband analog circuits and digital circuits, such as DSP, memory, or other signal processing circuit. The semiconductor die may also contain IPDs, such as inductors, capacitors, and resistors, for RF signal processing.

An electrically conductive layer 132 is patterned and deposited over substrate 130. Conductive layer 132 can be one or more layers of Al, Cu, Sn, Ni, Au, Ag, or other suitable electrically conductive material. Conductive layer 132 is formed using PVD, CVD, electrolytic plating, electrolysis plating process, or other suitable metal deposition process. Conductive layer 132 is a metal pad having electrical connection to the active and passive devices, IPDs, and conductive layers disposed in the semiconductor die.

A dielectric or insulating layer 134 is formed over substrate 130 and conductive layer 132. The dielectric layer 134 can be one or more layers of SiO2, Si3N4, SiON, Ta2O5, ZrO2, Al2O3, ZrO2, Al2O3, polyimide, BCB, PBO, or other material having suitable electrical insulating properties. The dielectric layer 134 is patterned or blanket deposited using PVD, CVD, printing, spin coating, sintering with curing, or thermal oxidation. A portion of dielectric layer 134 is removed by an etching process to expose conductive layer 132.

An optional repassivation or insulating layer 136 is formed over dielectric layer 134 and conductive layer 132. The passivation layer 136 can be one or more layers of SiO2, Si3N4, SiON, Ta2O5, Al2O3, polyimide, epoxy-based dielectric polymer, PBO, or other material having insulating and structural properties. The passivation layer 136 is patterned or blanket deposited using PVD, CVD, printing, spin coating, sintering with curing, or thermal oxidation. A portion of passivation layer 136 is removed by an etching process to expose conductive layer 132.

An optional electrically conductive layer 138 is patterned and deposited over passivation layer 136 and conductive layer 132. Conductive layer 138 can be one or more layers of Al, Cu, Sn, Ni, Au, Ag, Ti, TiW, or other suitable electrically conductive material. Conductive layer 138 typically has a top layer with good wetting capability to solder material. For example, conductive layer 138 can be multiple layers of TiW/Cu, Ti/Cu, Ti/NiV/Cu, or TiW/NiV/Cu. Conductive layer 138 uses PVD, CVD, electrolytic plating, electrolysis plating process, or other suitable metal deposition process. Conductive layer 138 operates as a runner or RDL to extend the interconnectivity of conductive layer 132.

An optional passivation or insulating layer 140 is formed over passivation layer 136 and conductive layer 138. The passivation layer 140 can be one or more layers of SiO2, Si3N4, SiON, Ta2O5, Al2O3, polyimide, epoxy-based dielectric polymer, PBO, WPR, or other material having insulating and structural properties. The passivation layer 140 is patterned or blanket deposited using PVD, CVD, printing, spin coating, sintering with curing, or thermal oxidation. A portion of passivation layer 140 is removed by an etching process to expose conductive layer 138.

Figure 5B:
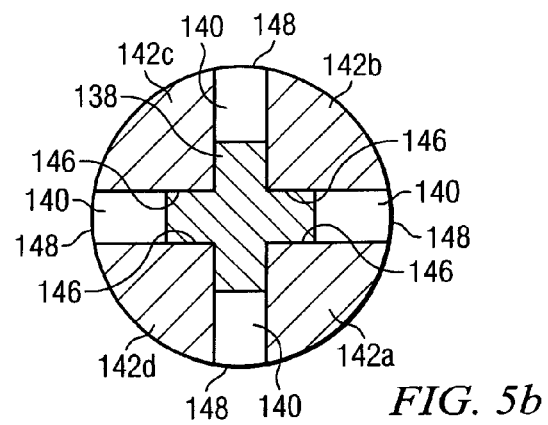

An electrically conductive layer 142 is patterned and deposited over conductive layer 138 as individual portions or sections 142a-142d. Conductive layer 142 can be one or more layers of Al, Cu, Sn, Ni, Au, Ag, or other suitable electrically conductive material, with a top layer having good wetting capability to solder material, e.g. Cu or Au. Conductive layer 142 uses PVD, CVD, electrolytic plating, electrolysis plating process, or other suitable metal deposition process. In one embodiment, conductive layer 142 is selectively plated with TiW or Ti/Cu as a seed layer including the sloped area 146. Conductive layer 142 is a UBM build-up structure or area over conductive layer 138. FIG. 5b is a top view of conductive layer 142a-142d, conductive layer 138, and passivation layer 140. The shape of conductive layer 142 can be linked islands with connection line protecting passivation layer 140 via opening edge on conductive layer 138.

An electrically conductive solder material is deposited over conductive layers 138 and 142 using an evaporation, electrolytic plating, electrolysis plating, ball drop, or screen printing process. The solder material can be any metal or other electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical ball or bump 144. In some applications, solder bump 144 is reflowed a second time to improve electrical contact to conductive layers 138 and 142. Solder bumps 144 represent one type of interconnect structure that can be formed over conductive layer 138. The interconnect structure can also use bond wires, 3-D interconnects, conductive paste, stud bump, micro bump, or other electrical interconnect.

Conductive layer 142 enhances solder joint reliability. The sloped sidewalls 146 of conductive layer portions 142a-142d increase the metal contact area between UBM 142 and solder bump 144 for better solder joint reliability. The enhanced UBM structure 142 redistributes the stress from the edge of the contact area of solder bump and UBM to the center area so as to improve solder joint reliability. The height of solder bump 144 can be increased without making the UBM footprint larger and without loss of solder joint reliability. The gaps or exits 148 between conductive layer portions 142a-142d provide a flux vapor escape path, away from the sloped sidewalls of conductive layer 142, to minimize formation of voids under solder bumps 144.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first insulating layer over the substrate;
   forming an under bump metallization layer (UBM) over the first insulating layer;
   forming a build-up structure over the UBM, the build-up structure being confined within a footprint of the UBM;
   forming a bump over the UBM and build-up structure;
   forming the build-up structure in sections occupying less than an area of the UBM; and
   forming exits between the sections of the build-up structure for flux vapor escape.

2. The method of claim 1, wherein the build-up structure extends above the UBM to a height of 2-20 micrometers.

3. The method of claim 1, wherein the build-up structure is plated with TiW/Cu, Ti/Cu, Ti/NiV/Cu, or TiW/NiV/Cu.

4. The method of claim 1, further including:
   forming a first conductive layer over the substrate;
   forming a second insulating layer over the first conductive layer; and
   forming a second conductive layer over second insulating layer and first conductive layer, the second conductive layer being electrically connected to the UBM.

5. The method of claim 4, wherein the second conductive layer is a redistribution layer to extend interconnectivity of the second conductive layer.

6. A method of making a semiconductor device, comprising:
   providing a substrate;
   forming a first insulating layer over the substrate;
   forming a first conductive layer over the first insulating layer;
   forming an under bump metallization (UBM) build-up structure over the first conductive layer;
   forming a bump over the first conductive layer and UBM build-up structure; and
   forming the UBM build-up structure in sections with exits for flux vapor escape.

7. The method of claim 6, wherein the UBM build-up structure extends above the first conductive layer to a height of 2-20 micrometers.

8. The method of claim 6, wherein the UBM build-up structure is plated with TiW/Cu, Ti/Cu, Ti/NiV/Cu, or TiW/NiV/Cu.

9. The method of claim 6, further including:
   forming a second conductive layer over the substrate;
   forming a second insulating layer over the first conductive layer; and
   forming the first conductive layer over second insulating layer and second conductive layer, the second conductive layer being electrically connected to the first conductive layer.

10. The method of claim 9, wherein the first conductive layer is a redistribution layer with adhesive, barrier, and wetting layers to extend interconnectivity of the second conductive layer.

11. A method of making a semiconductor device, comprising:
    providing a substrate;
    forming a first insulating layer over the substrate;
    forming a first conductive layer over the first insulating layer;
    forming an under bump metallization (UBM) build-up structure over the first conductive layer;
    forming an interconnect structure over the first conductive layer and UBM build-up structure;
    forming a second conductive layer over the substrate;
    forming a second insulating layer over the first conductive layer; and
    forming the first conductive layer over second insulating layer and second conductive layer, the second conductive layer being electrically connected to the first conductive layer.

12. The method of claim 11, further including forming the UBM build-up structure in sections with exits for flux vapor escape.

13. The method of claim 11, wherein the UBM build-up structure extends above the first conductive layer to a height of 2-20 micrometers.

14. The method of claim 11, further including forming a connection line between edge islands to protect a via opening edge of the second insulating layer on the first conductive layer.

15. The method of claim 11, wherein the first conductive layer is a redistribution layer to extend interconnectivity of the second conductive layer.

16. A semiconductor device, comprising:
    a substrate;
    a first insulating layer formed over the substrate;
    a first conductive layer formed over the first insulating layer;
    an under bump metallization (UBM) build-up structure formed over the first conductive layer; and
    an interconnect structure formed over the first conductive layer and UBM build-up structure, wherein the UBM build-up structure is formed in sections with exits for flux vapor escape.

17. The semiconductor device of claim 16, wherein the UBM build-up structure has a sloped sidewall.

18. The semiconductor device of claim 16, wherein the interconnect structure includes a bump.

19. The semiconductor device of claim 16, further including:
    a second conductive layer formed over the substrate; and
    a second insulating layer formed over the first conductive layer, the first conductive layer being formed over second insulating layer and second conductive layer.

20. A method of making a semiconductor device, comprising:
    providing a substrate;
    forming a first insulating layer over the substrate;
    forming a first conductive layer over the first insulating layer;
    forming an under bump metallization (UBM) build-up structure in sections over the first conductive layer with an exit port between the sections; and
    forming an interconnect structure over the first conductive layer and UBM build-up structure.

21. The method of claim 20, wherein the UBM build-up structure extends above the first conductive layer to a height of 2-20 micrometers.

22. The method of claim 20, further including:
    forming a second conductive layer over the substrate;
    forming a second insulating layer over the first conductive layer; and
    forming the first conductive layer over second insulating layer and second conductive layer, the second conductive layer being electrically connected to the first conductive layer.

23. The method of claim 22, further including forming a connection line between edge islands to protect a via opening edge of the second insulating layer on the first conductive layer.

24. The method of claim 22, wherein the first conductive layer is a redistribution layer to extend interconnectivity of the second conductive layer.

* * * * *